US011624983B2

(12) United States Patent
Vest et al.

(10) Patent No.: US 11,624,983 B2
(45) Date of Patent: Apr. 11, 2023

(54) METHOD AND SYSTEM FOR THERMAL PROCESSING OF FLEXO PRINTING ELEMENTS

(71) Applicant: MacDermid Graphics Solutions, LLC, Waterbury, CT (US)

(72) Inventors: Ryan W. Vest, Mequon, WI (US); Gary T. Markhart, Temecula, CA (US)

(73) Assignee: MacDermid Graphics Solutions, LLC, Waterbury, CT (US)

( * ) Notice: Subject to any disclaimer, the term of this patent is extended or adjusted under 35 U.S.C. 154(b) by 0 days.

(21) Appl. No.: 17/462,184

(22) Filed: Aug. 31, 2021

(65) Prior Publication Data
US 2023/0065357 A1    Mar. 2, 2023

(51) Int. Cl.
G03F 7/20    (2006.01)
(52) U.S. Cl.
CPC .......... G03F 7/2012 (2013.01); G03F 7/2004 (2013.01)
(58) Field of Classification Search
CPC .............................. G03F 7/2012; G03F 7/2004
See application file for complete search history.

(56) References Cited

U.S. PATENT DOCUMENTS

| | | |
|---|---|---|
| 3,264,103 A | 8/1966 | Cohen et al. |
| 3,926,297 A | 12/1975 | Guenst, Jr. et al. |
| 5,175,072 A | 12/1992 | Martens |
| 5,262,275 A | 11/1993 | Fan |
| 5,279,697 A | 1/1994 | Peterson et al. |
| 5,925,500 A | 7/1999 | Yang et al. |
| 6,238,837 B1 | 5/2001 | Fan |
| 6,605,410 B2 | 8/2003 | Yang et al. |
| 6,773,859 B2 | 8/2004 | Fan et al. |
| 7,122,295 B2 | 10/2006 | Mengel et al. |
| 2003/0044380 A1 | 3/2003 | Zhu et al. |
| 2004/0146806 A1 | 7/2004 | Roberts et al. |
| 2005/0123856 A1 | 6/2005 | Roberts |
| 2010/0119978 A1* | 5/2010 | Vest ........................ G03F 7/36 430/306 |
| 2013/0316290 A1* | 11/2013 | Vest ...................... G03F 7/2012 430/306 |

FOREIGN PATENT DOCUMENTS

| | | |
|---|---|---|
| EP | 1239329 | 9/2002 |
| WO | 0118604 | 3/2001 |
| WO | 0188615 | 11/2001 |

* cited by examiner

Primary Examiner — Mesfin T Asfaw
(74) Attorney, Agent, or Firm — Carmody Torrance Sandak & Hennessey, LLP

(57) ABSTRACT

The present disclosure is directed to a system and method configured for curing non-reactive photopolymer collected by an absorbent blotting material during thermal processing of flexographic printing elements. Uncured non-reacted portions of the photopolymer are removed by contacting the one or more layers of photopolymer with the web of absorbent blotting material at an elevated temperature to soften or liquefy the uncured non-reacted portions of the one or more layers of photopolymer and absorb the softened or liquefied uncured non-reacted portions into the absorbent web of absorbent blotting material. The web of absorbent blotter material containing the absorbed softened or liquefied non-reacted portions of the photopolymer is exposed to actinic radiation from the one or more UV light sources to crosslink and cure the softened or liquefied non-reacted portions of the photopolymer.

15 Claims, 1 Drawing Sheet

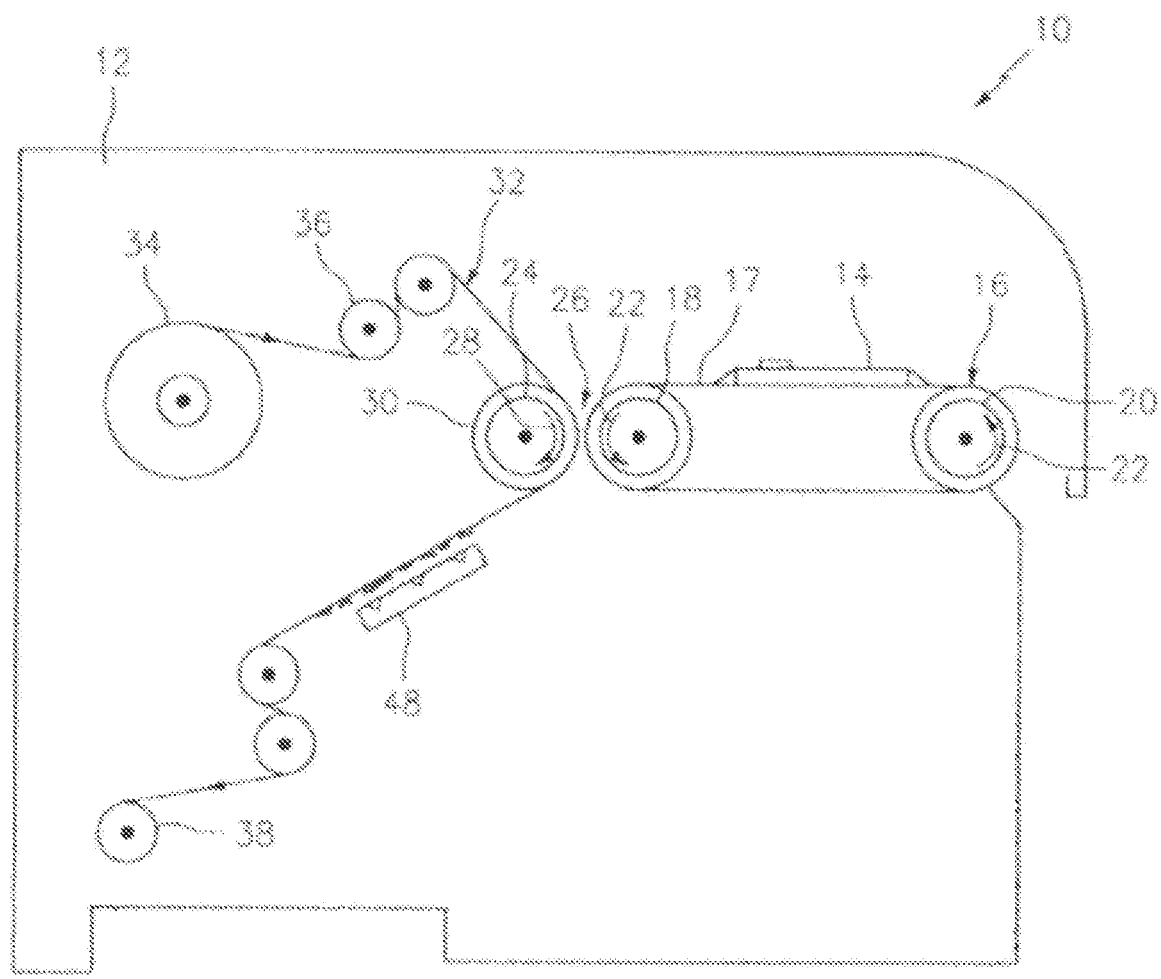

METHOD AND SYSTEM FOR THERMAL PROCESSING OF FLEXO PRINTING ELEMENTS

FIELD OF THE INVENTION

The present disclosure generally relates to a system and method configured for curing non-reactive photopolymer collected by an absorbent blotting material during thermal processing of flexographic printing elements.

BACKGROUND OF THE INVENTION

Flexography is a method of printing that is commonly used for high-volume runs. Flexography is employed for printing on a variety of substrates such as paper, paperboard stock, corrugated board, films, foils and laminates. Flexographic printing elements are relief plates with image elements raised above open areas. Such plates offer a number of advantages to the printer, based chiefly on their durability and the ease with which they can be made.

A typical flexographic printing element is a multilayered article made of, in order, a backing or support layer, one or more unexposed photocurable layers, a protective layer or slip film, and a cover sheet. The photocurable printing element can be in the form of a continuous (seamless) sleeve or as a flat, planar plate that is mounted on a carrier. The relief image in the flexographic printing element is produced by imaging and exposing the one or more unexposed photocurable layers. This is generally accomplished by selectively exposing the one or more photocurable layers to actinic radiation, which exposure acts to harden or crosslink the one or more photocurable layers in the irradiated areas.

The one or more photocurable layers are formed of a photopolymerizable material that generally includes one or more binders, one or more reactive monomers, one or more photoinitiators, and other performance additives. Examples of photopolymerizable compositions include those described in U.S. Patent Application Publication No. 2004/0146806, the teachings of which are incorporated herein by reference in their entirety. Various photopolymerizable compositions include those based on polystyrene-isoprene-styrene, polystyrene-butadiene-styrene, polyurethanes and/or thiolenes as binders can be used. Preferred binders include, for example, polystyrene-isoprene-styrene, and polystyrene-butadiene-styrene, especially block co-polymers of the foregoing.

The printing element can be selectively exposed to actinic radiation in various ways. In one alternative, a photographic negative with transparent areas and substantially opaque areas is used to selectively block the transmission of actinic radiation to the printing plate element. In another alternative, the photopolymer layer is coated with an actinic radiation (substantially) opaque layer that is sensitive to laser ablation. A laser is then used to ablate selected areas of the actinic radiation opaque layer creating an in situ negative. This technique is well-known in the art and is described for example in U.S. Pat. Nos. 5,262,275 and 6,238,837 to Fan, and in U.S. Pat. No. 5,925,500 to Yang et al., the subject matter of each of which is herein incorporated by reference in its entirety. In yet another alternative, a focused beam of actinic radiation is used to selectively expose the photopolymer. Any of these methods is acceptable, with the criteria being the ability to selectively expose the photopolymer to actinic radiation thereby selectively curing portions of the photopolymer.

Next, the photopolymer layer of the printing element is developed to remove uncured (i.e., non-crosslinked) portions, without disturbing the cured portions of the photopolymer layer, and reveal the relief image. The development step can be accomplished in a variety of ways, including water washing, solvent washing, and thermal development (or processing).

During thermal processing, the differential melting temperature between cured and uncured photopolymer is used to develop the latent image. The basic parameters of this process are known, as described in U.S. Pat. Nos. 7,122,295, 6,773,859, 5,279,697, 5,175,072 and 3,264,103 and in WO01/88615, WO01/18604, and EP1239329, the subject matter of each of which is incorporated herein by reference in its entirety. These processes allow for the elimination of development solvents and the lengthy plate drying times needed to remove the solvent. The speed and efficiency of these processes allow for their use in the manufacture of flexographic printing elements for printing newspapers and other publications where quick turnaround times and high productivity are important.

In order for a printing element to be thermally developable, the composition of the photopolymer must be such that there exists a substantial difference in the melt temperature between the cured and uncured polymer. It is precisely this difference that allows the creation of an image in the photopolymer when heated. The uncured photopolymer (i.e., the portions of the photopolymer not contacted with actinic radiation) melts and/or substantially softens while the cured photopolymer remains solid and intact at the temperature chosen. The difference in melt temperature allows the uncured photopolymer to be selectively removed thereby creating the desired image.

During thermal development, the printing element is heated to a temperature of at least about 140° C. The exact temperature depends upon the properties of the particular photopolymer being used. However, two primary factors should be considered in determining the development temperature:

(1) The development temperature is preferably set between the melt temperature of the uncured photopolymer on the low end and the melt temperature of the cured photopolymer on the upper end to allow selective removal of the photopolymer, thereby creating the image; and (2) the temperature should be sufficient to melt or substantially soften the uncured photopolymer thereby allowing it to be removed, and the higher the development temperature, the quicker the process time will be. However, the development temperature should not be so high as to exceed the melt temperature of the cured photopolymer or so high that it will degrade the cured photopolymer.

Thereafter, uncured photopolymer can be softened and/or melted and removed.

In one type of thermal processor, the heated printing element is brought into contact with a web of an absorbent blotter material that absorbs or otherwise removes the softened and/or melted uncured photopolymer. This removal process is generally referred to as "blotting."

Upon completion of blotting, if desired, the printing plate element can be post-exposed to further actinic radiation and/or subjected to detackification, cooled and is then ready for use.

Uncured photopolymer (i.e., non-reactive plate material) is absorbed into the web of absorbent blotter material and is then rewound onto a roller for subsequent disposal. This non-reactive plate material may be classified as hazardous, depending on environmental regulations of a locality, as it could cause harm to the environment and be difficult to dispose of. In addition, a common method of disposal of the web or absorbent blotter material containing the non-reacted plate material is incineration, which can release volatile materials to the air.

Based thereon, it would be desirable to provide an improved method of disposing of the web of absorbent blotter material containing non-reacted material that makes disposal of the materials easier and that is better for the environment.

SUMMARY OF THE INVENTION

It is an object of the present invention to provide an improved method of treating non-reactive materials absorbed into a web of absorbent blotter material during thermal processing.

It is another object of the present invention to provide an improved means of disposing of a used web of absorbent blotter material that contains the non-reactive materials absorbed therein.

It is still another object of the present invention to provide a method of reacting non-reactive components to crosslink the non-reactive components contained in a web of absorbent blotter material.

It is another object of the present invention to provide a method of disposing of a used web of absorbent blotter material that is safer for the environment.

It is still another object of the present invention to provide a method of disposing of a used web of blotter material that reduces the cost of disposal.

To that end, in one embodiment, the present invention relates generally to a method of curing non-reacted photopolymer absorbed into a web of absorbent blotter material during thermal processing of a flexographic printing elements in a thermal developing assembly, wherein the thermal developing assembly receives an imaged and exposed flexographic printing element, the imaged and exposed flexographic printing element comprising one or more layers of photopolymer, the one or more layers of photopolymer comprising crosslinked cured portions of photopolymer that form a cured relief image and uncured non-reacted portions of photopolymer that are removed during thermal processing to reveal the cured relief image, wherein the uncured non-reacted portions of the photopolymer are removed by contacting the one or more layers of photopolymer with the web of absorbent blotting material at an elevated temperature to soften or liquefy the uncured non-reacted portions of the one or more layers of photopolymer and absorb the softened or liquefied uncured non-reacted portions into the absorbent web of absorbent blotting material, the method comprising the steps of:
a) arranging one or more UV light sources in the thermal processor adjacent to a width of the absorbent blotter material containing the absorbed softened or liquefied non-reacted portions of the photopolymer, wherein the absorbent web of blotter material containing the absorbed softened or liquefied non-reacted portions of the photopolymer moves relative to the one or more UV light sources; and
b) exposing the web of absorbent blotter material to actinic radiation from the one or more UV light sources to crosslink and cure the softened or liquefied non-reacted portions of the photopolymer as the absorbent web of blotter material moves relative to the one or more UV light sources.

The present disclosure provides an improved method of treating and disposing of nonreactive materials absorbed into a web of absorbent blotter material during thermal processing and an improved means for disposing of the web of absorbent blotter material containing the nonreactive materials absorbed therein.

The system includes one or more UV light sources which are arranged in close proximity to at least a portion of the web of absorbent material.

Any combination or permutation of features, functions and/or embodiments as disclosed herein is envisioned. Additional advantageous features, functions and applications of the disclosed systems and methods of the present disclosure will be apparent from the description which follows, particularly when read in conjunction with the appended FIGURES.

BRIEF DESCRIPTION OF THE DRAWINGS

Features and aspects of embodiments are described below with reference to the accompanying drawings, in which elements are not necessarily depicted to scale, and in certain views, parts may have been exaggerated or removed for purposes of clarity.

Exemplary embodiments of the present disclosure are further described with reference to the appended figures. It is to be noted that the various features, steps and combinations of features/steps described below and illustrated in the FIGURES can be arranged and organized differently to result in embodiments which are still within the scope of the present disclosure.

The present invention will now be described with reference to the following figures, in which:

FIG. 1 schematically depicts a cross-sectional view of an exemplary thermal-based developing system according to the present disclosure;

Also, while not all elements may be labeled in each FIGURE, all elements with the same reference number indicate similar or identical parts.

DETAILED DESCRIPTION OF THE INVENTION

The present disclosure provides a system and method configured for curing non-reactive photopolymer collected by an absorbent blotting material during thermal processing of flexographic printing elements.

It should be understood, however, that the disclosed embodiments are merely illustrative of the present disclosure, which may be embodied in various forms. Therefore, details disclosed herein with reference to exemplary assemblies/fabrication methods and associated processes/techniques of assembly and use are not to be interpreted as limiting, but merely as the basis for teaching one skilled in the art how to make and use the advantageous assemblies/systems described herein.

As used herein, "a," "an," and "the" refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath", "below", "lower", "above", "upper". "front", "back", and the like, are used for ease of description to describe one element or feature's relationship to another element(s) or feature(s). It is further understood that the terms "front" and "back" are not intended to be limiting and are intended to be interchangeable where appropriate.

As used herein, the terms "comprise(s)" and/or "comprising," specify the presence of stated features, integers, steps, operations, elements, and/or components, but do not preclude the presence or addition of one or more other features, integers, steps, operations, elements, components, and/or groups thereof.

As used herein, absorbent material may also be referred to as a "blotter," "blotting material," "absorbent web," or "web of absorbent blotter material" without departing from the spirit/scope of this disclosure.

The present invention uses a UV light source to expose and crosslink the uncured non-reacted photopolymer which has been absorbed into the web of absorbent blotter material during thermal processing. The exposed and crosslinked material is cured and hardened and the web or absorbent blotter material is then wound onto a rewind roller for easy and safe disposal.

In one embodiment, the present invention relates generally to a method of curing non-reacted photopolymer absorbed into a web of absorbent blotter material during thermal processing of a flexographic printing elements in a thermal developing assembly, wherein the thermal developing assembly receives an imaged and exposed flexographic printing element, the imaged and exposed flexographic printing element comprising one or more layers of photopolymer, the one or more layers of photopolymer comprising crosslinked cured portions of photopolymer that form a cured relief image and uncured non-reacted portions of photopolymer that are removed during thermal processing to reveal the cured relief image, wherein the uncured non-reacted portions of the photopolymer are removed by contacting the one or more layers of photopolymer with the web of absorbent blotting material at an elevated temperature to soften or liquefy the uncured non-reacted portions of the one or more layers of photopolymer and absorb the softened or liquefied uncured non-reacted portions into the absorbent web of absorbent blotting material, the method comprising the steps of:
a) arranging one or more UV light sources in the thermal processor adjacent to and at a distance from a width of the absorbent blotter material containing the absorbed softened or liquefied non-reacted portions of the photopolymer, wherein the absorbent web of blotter material containing the absorbed softened or liquefied non-reacted portions of the photopolymer moves relative to the one or more UV light sources; and
b) exposing the web of absorbent blotter material to actinic radiation from the one or more UV light sources to crosslink and cure the softened or liquefied non-reacted portions of the photopolymer as the absorbent web of blotter material moves relative to the one or more UV light sources.

Thereafter, the web of absorbent blotter material, which now contains the hardened, crosslinked and cured non-reacted portions, can be wound onto a rewind roller.

Preferred UV light sources operate at a wavelength within the range of about 365 to 405 nm. Various UV light sources can be used, including, for example, LEDs, fluorescent, or another similar sourced.

In one embodiment, the UV light sources operate at a wavelength of 365 nm. The UV light sources can operate at higher wavelengths such as 390 nm, but it can take longer to expose.

The intensity of the UV light sources is typically within a range of about 11 to 16 $mW/cm^2$, more preferably about 13 to 15 $mW/cm^2$. This intensity changes as the power and quantity of the light sources is changed and as the distance of the UV light sources from the surface of the web of absorbent blotter material changes. In one embodiment, the intensity of the UV light sources is 13 to 15 $mW/cm^2$ when the UV light sources are arranged at a distance of about 0.5 inches from the surface of the web of absorbent blotter material.

An important parameter of the UV light sources is the Dose, which is defined as:

Dose=Intensity(of the light source)×Dwell(time of exposure)

The Dose changes with the type of light, time of exposure and the photopolymer itself.

In one aspect of the invention, the UV light source comprises of one or more UV-LEDs, preferably a plurality of UV-LEDs that are arranged across the width of the blotter material. In one embodiment, the plurality of UV-LEDs are arrange in a row across the width of the blotter material at least approximately equidistant from each other. In one embodiment, additional rows of UV-LEDs are used to increase curing or dose. The use of higher intensity UV-LEDs also requires less time to obtain the same Dose.

It is desirable that the web of absorbent blotter material is uniformly exposed to actinic radiation from the UV light sources so that all of the uncured unreacted material contained in the web of absorbent blotter material is crosslinked and cured. In one embodiment, the UV-LEDs are arranged in close proximity to each other so that the light (i.e., UV radiation) overlap is uniform. In one aspect, the UV-LEDs are arranged close together to increase the intensity and obtain the required Dose and to crosslink the photopolymer faster. The number of UV-LEDs will depend in part on the intensity of each individual UV-LED, the distance of the UV-LEDs from the web of absorbent blotter material, and the width of the web of absorbent blotter material.

For example, the UV-LEDs may be spaced approximately equidistantly about 12.5 mm (0.5 inches) from each other along the width of the web of absorbent blotter material. This spacing is only one example of a spacing of UV-LEDs and the spacing can be changed as different arrangements or configurations of UV-LEDs are tested.

In one embodiment, the sources of UV light, such as the UV-LEDs, are fixably mounted in the enclosure of the thermal processor and the blotter material passes continuously under or relative to the fixably mounted UV-LEDs. In one embodiment, the speed of the web of absorbent blotter material relative to the fixably mounted sources of UV light is within the range of about 1 to about 10 ft/min, more preferably about 5 ft/min (1 inch/sec).

To calculate the required Dose, data from a typical light exposure unit which is used to expose through a bottom of the plate to give the "floor" across the entire plate was analyzed.

From this standard UV exposure light source, it was determined that the Dose required to cure 0.002 inches of photopolymer in a stationary system using a light source having an intensity of 30 mW/cm$^2$ is 5 seconds. This gives a Dose of 30 mW/cm$^2$×5 seconds=150 mJ/cm$^2$. In addition, we can calculate that approximately 0.002 inches of photopolymer (uncured un-reacted photopolymer) is removed on average per pass of the blotter material (plate relief of 0.024 inches/12 passes=0.002 inches of polymer per pass) in the thermal processor during thermal processing. As described herein, during thermal processing the web of absorbent blotter material is brought into contact with the flexographic relief image printing element at an elevated temperature that softens or liquefies the uncured non-reacted portions of the photopolymer and the uncured non-reacted portions are absorbed into the web of absorbent blotter material.

In one embodiment, the Dose is at least 130 mJ/cm$^2$, preferably at least 140 mJ/cm$^2$, more preferably at least 150 mJ/cm$^2$ and more preferably at least 160 mJ/cm$^2$. The inventors of the present invention have found that a Dose within this range is able to fully cure the uncured un-reacted photopolymer absorbed in the web of absorbent blotter material for subsequent disposal.

However, this high Dose can be difficult to achieve, depending on the particular source of UV light.

For example, many common UV-LEDs have an intensity of only about 13-14 mW/cm$^2$. So, a larger number of UV-LEDs would be needed to achieve the desired Dose. For examples, using 3 rows of LEDs with one inch distance between them and a web speed of 5 ft/min, would require a Dwell time of 9-10 seconds (Dose/Intensity) and would also require a large number of UV LEDs. In order to reduce the exposure/dwell time and the number of rows of LEDs, it is therefore necessary to either increase the intensity of the LEDs themselves or to pack them closer together.

On the other hand, a lower web process speed may be better suited for UV-LEDs. With a lower process time of about 2 to 3 ft/min, more preferably 2.5 to 2.7 ft/min, and with an Intensity of 13-14 mW/cm$^2$, the number of UV-LEDs and/or number of rows of UV-LEDs can be reduced by 50%.

To cover higher production speeds (i.e., 5 ft/min or more), fluorescent UV exposure tubes could also be used. With fluorescent UV exposure tubes, the intensity is approximately 30 mW/cm$^2$ and to achieve the same Dose (30 m/cm$^2$×5 second), only need 5 seconds of exposure would be needed. Each standard UV tube is approximately 1 inch in diameter, the exposure could be done with 5 UV fluorescent light tubes. While this may appear to be the better option, the UV fluorescent light tubes are fragile and can easily break if mishandled.

The speed of the blotter is constant in the thermal system before and after the array of lights. Typically, processing speed of the blotter will remain the same throughout the processing. Extra rows of LEDs or UV lamps could easily be added and/or switched on/off as machine process speed is increase. Therefore, in one embodiment, the system includes enough light sources to cover all situations, including blotter speed, particular photopolymers, etc. along with a control mechanism to adjust the speed of the web and the number/location of the light sources being used.

Due to the difficulty of monitoring reactivity on-the-fly, Dose requirement is chosen so as to be higher than necessary, with a safety factor. However, one skilled in the art could determine the Dose requirement for a specialty type of photopolymer and/or higher intensity light sources, etc. by the process described herein.

Temperature has a negative effect on UV output and higher temperatures reduce UV output. In one embodiment, part of the design of the system includes heat sinks to remove/dissipate heat from the UV-LEDs. In addition, the temperature of the resin in the blotter generally has a positive effect. The resin is heated during the thermal process, which would increase the photopolymer reactivity and cause the required Dose to decrease. Therefore, optionally, the system may also include heaters to help cure the resin in the blotter. In one embodiment, if a heater is used to aid in curing the resin in the blotter, the required Dose is reduced either by using lower intensity/few number of light sources and/or decreasing dwell time.

The system described herein is usable with photopolymers that use a photoinitiator that operates in the range of about 365 to 405 nm. In addition, photopolymers, including various elements that can be polymerized more quickly, would reduce the cost of the unit by reducing the Dose required (i.e., decrease in light intensity and/or decrease dwell) to cure the plate.

In one embodiment, and as shown in FIG. 1, the present invention relates generally to a thermal developing assembly comprising a system 10 used to process a relief image printing element 14. The photosensitive printing element 14 typically includes a flexible substrate and at least one layer of photosensitive material deposited on the flexible substrate.

The system 10 includes an enclosure 12, a conveyor 16 including a continuous loop 17 wherein the photosensitive printing element 14 is positionable on the continuous loop 17 of the conveyor 16, at least one mounted heatable roller 24 in the enclosure 12, an absorbent blotter material 32 covering at least a portion of the at least one heatable roller 24, wherein the absorbent material 32 is capable of absorbing liquefied or softened uncured photosensitive material from the photosensitive printing element 14 when the photosensitive printing element 14 is brought into contact with the absorbent material 32 on a portion of the at least one heatable roller 24.

The system 10 for processing the photosensitive printing element 14 includes an enclosure 12 for housing at least the elements of the thermal-based developing system 10.

The thermal-based developing system 10 described herein accepts a previously formed and imagewise actinic radiation exposed flexible photosensitive printing element 14, the photosensitive printing element 14 having a base layer, an adjacent layer of a radiation hardenable elastomer material (curable layer), and optionally, an infrared sensitive layer which is used to form an in situ mask on the curable layer using laser radiation prior to exposure to actinic radiation, such as by laser ablation. Examples of photosensitive printing elements processable in the thermal-based developing system of the invention are described in U.S. Pat. No. 5,175,072 to Martens, U.S. Pat. Nos. 5,262,275 and 6,238,837 to Fan, and U.S. Pat. Nos. 5,925,500 and 6,605,410 to Yang et al., the subject matter of each of which is herein incorporated by reference in its entirety.

In one embodiment, and prior to processing in the thermal developing assembly described herein, a portion of the radiation curable layer is preferably cured by actinic radiation through the lower surface of the base to create a cured "floor layer." Next, the film is imagewise exposed from the opposite surface to cure the desired portions of the plate, through either a photographic negative or the in situ negative created by laser ablation of the mask layer. The remaining portion of the radiation curable layer after curing consists of cured portions and uncured portions. Thereafter, the photosensitive printing element is transferred to the thermal developing assembly to remove uncured portions of the radiation curable layer and reveal the relief image therein, wherein the relief image is made up of the crosslinked and cured portions of the radiation curable layer of the photosensitive printing element.

As described in FIG. 1, a conveyor 16 attached to a drive motor (not shown) is typically used to transport and convey the photosensitive printing element 14 into and through the thermal plate processing system. The conveyor 16 may be mounted in a fixed position in the enclosure 12 and includes a continuous loop 17 supported by at least a first roller 18 and a second roller 20. Optionally, one or more additional rollers (not shown) may be used to provide additional support to the conveyor 16 and prevent the continuous loop 17 from sagging from the weight of the photosensitive printing element 14. In one embodiment, the continuous loop 17 comprises a wire mesh.

The leading edge of the photosensitive printing element 14 may be held in place against the continuous loop 17 of the conveyor 16 by suitable fastening means (not shown), such as a clamp and/or vacuum. In one embodiment, a vacuum is provided to at least one of the first roller 18 and the second roller 20 of the conveyor 16, and used, alone or in combination with the fastening means, to hold the photosensitive printing element 14 in place on the continuous loop 17 of the conveyor 16.

During operation, the conveyor 16 with the photosensitive printing element 14 mounted thereon moves in a first direction 22 towards a heatable roller 24 such that the photosensitive printing element 14 passes through a gap 26 between the conveyor 16 and the heatable roller 24 as the continuous loop 17 of the conveyor 16 rotates over and around a second roller 20. In one embodiment, a heatable roller 24 rotates in an opposite direction 28 from the conveyor 16. The heatable roller 24 is capable of being urged towards the photosensitive printing element 14 positioned on the conveyor 16 as the conveyor moves in the first direction 22 and the heatable roller 24 moves in an opposite direction 28. Preferably, the heatable roller 24 is fixably mounted on a pivot (not shown), which allows it to be urged towards the conveyor 16.

In some embodiments, the heatable roller 24 is urged toward the photosensitive printing element 14 on the conveyor 16 using suitable means, such as one or more pneumatic cylinders (not shown). The pneumatic cylinder(s) positions the heatable roller 24 at a preset distance from the outer surface of the second roller 20 of the conveyor 16 to produce the gap 26 through which the photosensitive printing element 14 passes as it travels on the continuous loop 17 of the conveyor 16 around the second roller 20.

The web of absorbent material 32 is conducted over at least a portion of an outer surface 30 of the heatable roller 28. The web of absorbent material 32 is capable of absorbing (e.g., removing) uncured material that is liquefied or softened from the photosensitive printing element 14 when the heatable roller 24 rotates and is heated and the web of absorbent material 32 contacts at least a portion of the photosensitive printing element 14. The heatable roller 24 rotates in a direction 28 that is opposite to the direction 22 of the conveyor 16 so that the photosensitive printing element 14 and the web of absorbent material 32 can be contacted with each other and then separated.

Heat may be provided to the heatable roller 24 by a core heater that is capable of maintaining a skin temperature of the heatable roller 24 that is sufficient to soften or liquefy at least a portion of the photosensitive material. The temperature to which the heatable roller 24 is heated is chosen based on the composition of the photosensitive material and the melting temperature of the monomers and polymers contained within the photosensitive material. In one embodiment, the heatable roller 24 is heated to and operated at a temperature between about 150° C. and about 250° C. The upper limit may be determined in large part by the melting temperature of the web of absorbent material 32. That is, the temperature of the heatable roller 24 must be low enough so that when the web of absorbent material 32 is not moving and the portions of the web of absorbent material 32 contacting the heatable roller 24 are at rest and the absorbent material 32 does not melt. Although the heatable roller 24 preferably includes an electrical core heater to provide the desired skin temperature, the use of steam, oil, hot air, and a variety of other heating sources may also provide the desired skin temperature.

The web of absorbent material 32 is supplied to at least the portion of the outer surface 30 of the heatable roller 24 from a supply roll 34 of the web of absorbent material 32. The selection of the absorbent material 32 may depend in part upon the thickness of the photosensitive printing element 14 to be processed, the melting temperature of the web of absorbent material 32, and the heat transfer characteristics of both the photosensitive printing element 14 and the web of absorbent material 32. The web of absorbent material 32 may be non-woven or woven and suitable absorbent materials would be known to those skilled in the art and are usable in the present invention.

After being brought into contact with the flexographic printing element at an elevated temperature that softens or liquefies uncured non-reacted portions of the one or more photopolymer layers of the flexographic printing element, the web of absorbent material 32 has deposited or absorbed therein softened or liquefied photopolymer removed (i.e., absorbed) from the photosensitive printing element 14.

As described herein, the system 10 includes a UV light source 48. The UV light source (e.g., UV LED, UV fluorescent) 48 may be positioned in close proximity to the web of absorbent blotter material 32. For example, the UV light source may be positioned at a distance of about 0.25 to about 2 inches, more preferably at a distance of about 0.50 to about 1.0 inches from the web of absorbent blotter material 32. The UV light source 48 cures the liquefied or softened material that has been absorbed by the web of absorbent material 32. In a non-limiting example, the wavelength of the UV light source may be between about 365 nm to about 405 nm.

The desired intensity of the UV light source may be at least partially associated with at least one of the following, including but not limited to, the speed of the web of absorbent blotter material, the proximity of the UV light source to the web of absorbent blotter material, the wavelength of the UV light source, the operating parameters of the UV light source (e.g., the number of LEDs in an LED array), and combinations of the foregoing.

In some embodiments, the system 10 may include a second UV light source (not shown) arranged in close proximity to the first UV light source. For example, this second UV light source may be positioned opposite from the first UV light source such that the second UV light source crosslinks and cures softened or liquefied non-reacted photopolymer on the opposite side of the absorbent material 32.

In a non-limiting example, the wavelength of the second UV light source may be between about 365 nm to about 405 nm. In another non-limiting example, the desired intensity of the second UV light source may be at least partially associated with the elements of the first UV light source, as defined above. The wavelength and/or the intensity of the UV light source and the second UV light source may be similar to one another or may be different from one another. In addition, the second UV light source may be arranged at the same distance from the web of absorbent blotter material as the first UV light source. In one embodiment, both the first UV light source and the second UV light source are arranged at a distance of 0.5 to 1.0 inches from the web of absorbent blotter material.

Then, the absorbent material 32, containing the cured and non-reacted product, can be wound onto a take-up roller for subsequent removal and/or disposal.

The take-up roller 38 is independently belt driven by a motor (not shown), which is preferably a variable speed motor. The take-up roller 38 collects the "used" web of absorbent material 32 after it has contacted the photosensitive printing element 14 and removed portions of the photosensitive material that were liquefied or softened. The speed of the motor is adjusted so as to not interfere with the selected web tension. If the motor interferes with web tension, the resulting flexographic plate could potentially have variable heights in the relief portions or might warp and be commercially unacceptable.

In another embodiment, the system 10 may include a secondary heating source (not shown) that may be positioned adjacent to a point where the absorbent material 32 contacts the at least one layer of photosensitive material on the conveyor 16. The secondary heating source may provide an auxiliary heat source to further soften and liquefy portions of the at least one layer of photosensitive material on the conveyor 16.

It should be apparent to one skilled in the art that the conveyor 16, including first roller 18 and second roller 20 as well as the heatable roller 24 are driven by suitable means, i.e., a motor. In addition, a controller, such as a microprocessor may be used in the system of the invention to control the operation of each of the elements in the plate processor 10. Such controllers are well known in the art. One example of a controller used to control the various elements in a plate processor is described in U.S. Pat. No. 5,279,697 to Peterson et al., the subject matter of which is herein incorporated by reference in its entirety.

The method of the present invention includes the steps of:

(1) positioning a photosensitive printing element 14 on a conveyor 16, the conveyor 16 including a continuous loop 17 supported by at least a first roller 18 and a second roller 20, wherein the photosensitive printing element 14 is supported on the continuous loop 17;

(2) supplying an absorbent material 32 to at least a portion of an outer surface 30 of a heatable roller 24 that is mounted for rotation in the enclosure 12, wherein the absorbent material 32 is capable of absorbing uncured non-reacted portion of the one more photopolymer layers of the photosensitive printing element 14 when the heatable roller 24 is heated and rotates and the absorbent material 32 contacts at least a portion of the photosensitive printing element 14;

(3) heating the heatable roller 24 to a temperature sufficient to cause at least a portion of the at least one layer of photosensitive material to soften or liquefy when the absorbent material 32 contacts the at least one layer photosensitive material;

(4) causing a surface of the at least one layer of photosensitive material and the absorbent material 32 to come into contact at a point between the conveyor 16 and the heatable roller 24 such that at least a portion of the liquefied or softened material is absorbed by the absorbent material 32; and (5) arranging one or more UV light sources 48 in the thermal processor adjacent to a width of the absorbent blotter material 32 containing the absorbed softened or liquefied non-reacted portions of the photopolymer, wherein the absorbent web of blotter material 32 containing the absorbed softened or liquefied non-reacted portions of the photopolymer moves relative to the one or more UV light sources 48; and (6) exposing the web of absorbent blotter material 48 to actinic radiation from the one or more UV light sources 32 to crosslink and cure the softened or liquefied non-reacted portions of the photopolymer as the absorbent web of blotter material 32 moves relative to the one or more UV light sources 48.

Preferably, the photosensitive printing element is processed through the steps of the process several times so that most, if not all of the uncured photosensitive material is removed from the surface of the photosensitive printing element to obtain the relief image. The number of passes will depend in part on the thickness of the plate relief, the type of photopolymer, temperature of the thermal processor, etc. For example, for a plate relief of 0.024 inches, in which 0.002 inches of photopolymer (uncured un-reacted photopolymer) is removed on average per pass of the blotter material, 12 passes of the photosensitive printing element through the thermal processor would be required.

Suitable means for maintaining uniform tension in the web of absorbent material throughout the system may be used, including for example, one or more idler rollers 36. Other means for maintaining tension in the web may also be provided and would be known to those skilled in the art.

In some embodiments, one or more idler rollers 36 may be positioned in direct or indirect contact with the web of absorbent material 32. The one or more idler rollers 36 may facilitate a change in direction of the web of absorbent material 32 and/or may provide tension to the web of absorbent material 32 to maintain a uniform and desired tension. In some instances, two or more idler rollers 36 may be positioned in close proximity to each other. For example, two or more idler rollers 36 may be positioned in close proximity to each other such that the web of absorbent material 32 is closely wound (i.e., makes a sharp turn) in order to maintain at least partial contact with an exterior surface of each of the two or more idler rollers 36.

In some embodiments, the linear speed of the heatable roller 24, the web of absorbent material 32, and the photosensitive printing element 14 may be substantially the same to avoid any shear stress on the photosensitive printing element 14. The disclosed shear stress can cause uneven relief portion plate thickness.

Although the present disclosure has been described with reference to exemplary implementations, the present disclosure is not limited by or to such exemplary implementations. Rather, various modifications, refinements and/or alternative implementations may be adopted without departing from the spirit or scope of the present disclosure.

What is claimed is:

1. A method of curing non-reacted photopolymer absorbed into a web of absorbent blotter material during thermal processing of a flexographic printing elements in a thermal developing assembly, wherein the thermal developing assembly receives an imaged and exposed flexographic printing element, the imaged and exposed flexographic printing element comprising one or more layers of photopolymer, the one or more layers of photopolymer comprising crosslinked cured portions of photopolymer that form a cured relief image and uncured non-reacted portions of photopolymer that are removed during thermal processing to reveal the cured relief image, wherein the uncured non-reacted portions of the photopolymer are removed by contacting the one or more layers of photopolymer with the web of absorbent blotting material at an elevated temperature to soften or liquefy the uncured non-reacted portions of the one or more layers of photopolymer and absorb the softened or liquefied uncured non-reacted portions into the absorbent web of absorbent blotting material, the method comprising the steps of:
a) arranging one or more UV light sources in the thermal processor at a distance from a width of the absorbent blotter material containing the absorbed softened or liquefied non-reacted portions of the photopolymer, wherein the absorbent web of blotter material containing the absorbed softened or liquefied non-reacted portions of the photopolymer moves relative to the one or more UV light sources; and
b) exposing the web of absorbent blotter material to actinic radiation from the one or more UV light sources to crosslink and cure the softened or liquefied non-reacted portions of the photopolymer as the absorbent web of blotter material moves relative to the one or more UV light sources.

2. The method according to claim 1, further comprising the step of winding the web of absorbent blotter material containing the crosslinked and cured non-reacted portions onto a rewind roller.

3. The method according to claim 1, wherein the one or more UV light sources comprise one or more UV-LEDs, one or more fluorescent UV exposure tubes or combinations thereof.

4. The method according to claim 3, wherein the one or more UV light sources comprise a plurality of UV-LEDs, wherein an intensity of each of the one or more UV-LEDs is at least 10 $mW/cm^2$.

5. The method according to claim 4, wherein the intensity of each of the one or more UV-LEDs is at least 13 $mW/cm^2$.

6. The method according to claim 3, wherein the one or more UV light sources comprise a one or more fluorescent UV exposure tubes, wherein an intensity of each of the one or more fluorescent UV exposure tubes is at least 20 $mW/cm^2$.

7. The method according to claim 1 wherein the one or more UV light sources comprise a plurality of UV light sources arranged approximately equidistantly from each other across the width of the web of absorbent blotter material, wherein the width of the web of absorbent blotter material is uniformly exposed to actinic radiation from the one or more UV light sources.

8. The method according to claim 1, wherein the one or more UV light sources operate at a wavelength within the range of 365 to 405 nm.

9. The method according to claim 1, wherein the intensity of each of the one or more UV light sources is 13 to 15 $mW/cm^2$ when the one or more UV light sources are arranged at a distance of about 0.5 inches from the surface of the web of absorbent blotter material.

10. The method according to claim 9, wherein the one or more UV light sources comprise a one or more fluorescent UV exposure tubes, wherein an intensity of each of the one or more fluorescent UV exposure tubes is at least 30 $mW/cm^2$.

11. The method according to claim 10, wherein the Dose of the one or more UV light sources is at least 150 $mJ/cm^2$.

12. The method according to claim 1, wherein the Dose of the one or more UV light sources, defined as the intensity of the light sources times the dwell time of exposure, is at least 130 $mJ/cm^2$.

13. The method according to claim 12, wherein the Dose of the one or more UV light sources is at least 160 $mJ/cm^2$.

14. The method according to claim 1, further comprising one or more heaters positionable either before or after the one or more UV light sources, wherein the one or more heaters aid in curing the uncured un-reacted photopolymer in the web of absorbent blotter material.

15. The method according to claim 1, wherein a Dose of the one or more UV light sources, defined as the intensity of the light sources times the dwell time of exposure, is reduced by using a lower intensity UV light source, fewer UV light sources, or a decreased dwell time of exposure.

* * * * *